(12) United States Patent
Hashem

(10) Patent No.: US 7,621,570 B2
(45) Date of Patent: Nov. 24, 2009

(54) PRE-EXPANDED CONNECTOR FOR EXPANDABLE DOWNHOLE TUBULARS

(75) Inventor: Ghazi J. Hashem, Houston, TX (US)

(73) Assignee: Weatherford/Lamb, Inc., Houston, TX (US)

( * ) Notice: Subject to any disclaimer, the term of this patent is extended or adjusted under 35 U.S.C. 154(b) by 122 days.

(21) Appl. No.: 11/339,704

(22) Filed: Jan. 25, 2006

(65) Prior Publication Data

US 2006/0131881 A1    Jun. 22, 2006

Related U.S. Application Data

(63) Continuation of application No. 10/442,859, filed on May 21, 2003, now Pat. No. 7,125,053.

(60) Provisional application No. 60/387,489, filed on Jun. 10, 2002.

(51) Int. Cl.
*F16L 13/14*    (2006.01)
*F16L 9/22*    (2006.01)
*F16L 13/02*    (2006.01)
*F16L 15/00*    (2006.01)

(52) U.S. Cl. .................. 285/382.4; 285/288.1; 285/333; 285/382.2; 166/242.1; 138/109; 138/155

(58) Field of Classification Search .............. 285/288.1, 285/333, 334, 355, 390, 382, 382.1, 382.2, 285/382.4, 382.5; 138/109, 155; 166/242.1; 175/320
See application file for complete search history.

(56) References Cited

U.S. PATENT DOCUMENTS

| | | |
|---|---|---|
| 1,460,769 A | 7/1923 | Saunders |
| 2,005,631 A | 6/1935 | Pace |
| 2,065,595 A | 12/1936 | Lynch |
| 2,494,128 A | 1/1950 | Holmquist et al. |
| 3,067,593 A | 12/1962 | Gresham |
| 3,080,179 A | 3/1963 | Huntsinger |
| 3,232,638 A | 2/1966 | Bernard |

(Continued)

FOREIGN PATENT DOCUMENTS

DE    1015399    9/1957

(Continued)

OTHER PUBLICATIONS

World Oil; *Tubing Reference Tables 2002*; Gulf Publishing Co., 2002.

(Continued)

*Primary Examiner*—James M Hewitt
(74) *Attorney, Agent, or Firm*—Howrey LLP

(57) ABSTRACT

A method and apparatus for providing an expandable threaded connection between segments of expandable tubulars. Threaded connections are machined into pre-expanded ends of tubulars. Once the threaded connections are machined into the pre-expanded ends, two joints of tubulars are connected using the threads, thus creating a pre-expanded threaded connection. After a tubular string is made up and lowered into a wellbore, the entire length of the string is expanded using known methods for expanding tubulars. During the downhole expansion operation, the pre-expanded threaded connections experience minimal expansion. The minimal downhole expansion of the pre-expanded threaded connections allows the threaded connections to maintain their sealing ability and coupling strength.

24 Claims, 5 Drawing Sheets

U.S. PATENT DOCUMENTS

| | | | |
|---|---|---|---|
| 3,388,752 A | 6/1968 | Huntsinger et al. | |
| 3,475,038 A | 10/1969 | Matherne | |
| 3,489,437 A | 1/1970 | Duret | |
| 3,508,771 A | 4/1970 | Duret | |
| 3,520,561 A | 7/1970 | Rininger | |
| 3,989,284 A | 11/1976 | Blose | 285/18 |
| 4,124,232 A | 11/1978 | Ahlstone | |
| 4,192,533 A | 3/1980 | Blose | |
| 4,235,013 A * | 11/1980 | Vollmer | 29/727 |
| 4,278,138 A | 7/1981 | Rowley et al. | |
| 4,317,585 A | 3/1982 | Boice | |
| 4,328,982 A * | 5/1982 | Christianson | 285/351 |
| 4,328,983 A * | 5/1982 | Gibson | 285/382 |
| RE31,123 E | 1/1983 | Simmons | |
| 4,373,750 A * | 2/1983 | Mantelle et al. | 285/55 |
| 4,429,904 A | 2/1984 | Reimert | |
| 4,509,777 A | 4/1985 | Walker | |
| 4,530,527 A * | 7/1985 | Holmberg | 285/382.4 |
| 4,572,549 A | 2/1986 | Sidwell | |
| 4,601,491 A | 7/1986 | Bell et al. | |
| 4,629,225 A | 12/1986 | Rowsey | |
| 4,674,773 A | 6/1987 | Stone et al. | |
| 4,676,528 A | 6/1987 | Gray | |
| 4,688,828 A | 8/1987 | Shaffer | |
| 4,846,507 A | 7/1989 | Geary | |
| 4,893,658 A | 1/1990 | Kimura | |
| 5,083,608 A | 1/1992 | Abdrakhmanov et al. | 166/55 |
| 5,286,069 A * | 2/1994 | Wilson | 285/114 |
| 5,333,918 A | 8/1994 | Crout | |
| 5,348,095 A | 9/1994 | Worrall | |
| 5,709,417 A * | 1/1998 | Verbeck | 285/382 |
| 6,056,324 A * | 5/2000 | Reimert et al. | 285/18 |
| 6,106,024 A | 8/2000 | Floyd | 285/18 |
| 6,112,818 A | 9/2000 | Campbell | |
| 6,226,855 B1 * | 5/2001 | Maine | 29/507 |
| 6,328,113 B1 | 12/2001 | Cook | |
| 6,409,175 B1 * | 6/2002 | Evans et al. | 277/314 |
| 6,425,444 B1 | 7/2002 | Metcalfe et al. | |
| 6,454,013 B1 | 9/2002 | Metcalfe | |
| 6,457,532 B1 | 10/2002 | Simpson | |
| 6,510,896 B2 | 1/2003 | Bode et al. | |
| 6,607,220 B2 * | 8/2003 | Sivley, IV | 285/334 |
| 6,619,696 B2 * | 9/2003 | Baugh et al. | 285/92 |
| 6,634,431 B2 * | 10/2003 | Cook et al. | 166/387 |
| 6,681,875 B2 | 1/2004 | Larsson et al. | |
| 6,708,767 B2 | 3/2004 | Harrall et al. | 166/382 |
| 6,712,401 B2 * | 3/2004 | Coulon et al. | 285/331 |
| 6,745,845 B2 | 6/2004 | Cook et al. | |
| 6,745,846 B1 | 6/2004 | Innes | 166/387 |
| 6,764,110 B2 | 7/2004 | Russell | |
| 6,767,035 B2 | 7/2004 | Hashem | 285/333 |
| 6,808,210 B1 | 10/2004 | Harrison et al. | |
| 7,107,663 B2 * | 9/2006 | Ellington et al. | 29/523 |
| 7,350,563 B2 | 4/2008 | Waddell et al. | 166/207 |
| 2003/0067166 A1 | 4/2003 | Sivley | |
| 2003/0107213 A1 * | 6/2003 | Baugh et al. | 285/92 |
| 2004/0148758 A1 * | 8/2004 | Lohbeck et al. | 29/523 |

FOREIGN PATENT DOCUMENTS

| | | |
|---|---|---|
| WO | WO 99/23354 | 5/1999 |
| WO | WO 01/04535 A1 | 1/2001 |
| WO | WO 01/18353 A1 | 3/2001 |
| WO | WO 03/015954 A | 2/2003 |

OTHER PUBLICATIONS

Rucker/Atlas Bradford; *Tubing String Design Manual*, Jul. 1972.

\* cited by examiner

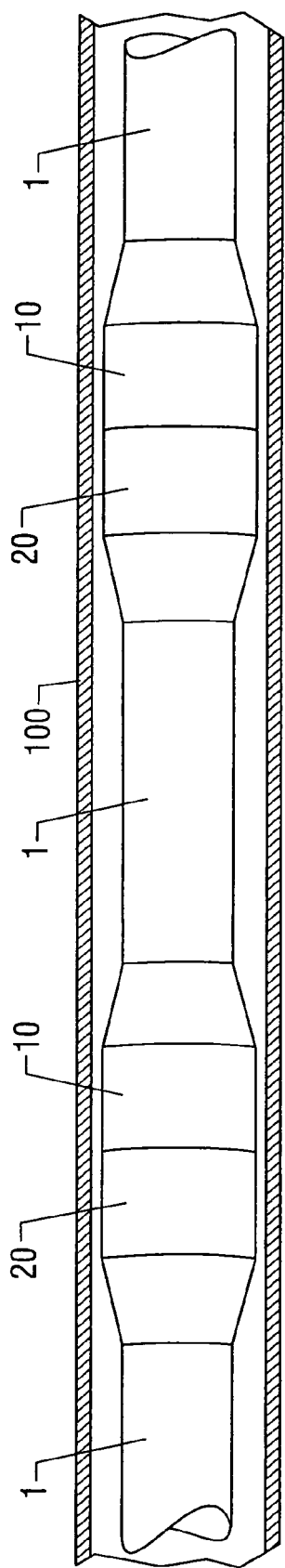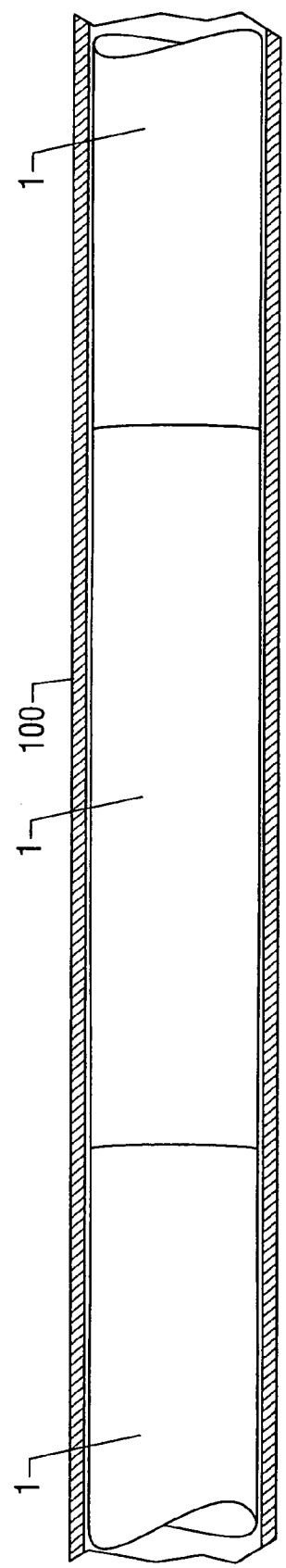

PRE-EXPANDED CONNECTOR FOR EXPANDABLE DOWNHOLE TUBULARS

This application is a continuation application of U.S. patent application Ser. No. 10/442,859, filed May 21, 2003 by Ghazi J. Hashem, now U.S. Pat. No. 7,125,053 issued on Oct. 24, 2006, which claims the benefit of U.S. Provisional Application No. 60/387,489, filed Jun. 10, 2002, each incorporated by reference herein in its entirety.

FIELD OF THE INVENTION

The present invention relates to threaded tubular connections for expandable tubulars particularly useful in the oil and gas industry. In particular, the invention relates to a pre-expanded threaded tubular connection that maintains its sealing capacity and coupling strength after expansion of the tubulars downhole.

BACKGROUND OF THE INVENTION

In the conventional drilling of an oil and gas well, a series of tubulars, typically strings of casing, liner, and/or screen segments connected together, are sequentially installed in the well bore until the depth of the producing zone of the formation is reached. Standard practice requires that each succeeding string of tubulars placed in the well bore has an outside diameter smaller than the preceding string of tubulars and/or bore hole such that the tubular segments can be passed through the preceding string of tubulars and/or bore hole to their downhole location. The reduction in the diameter of each successive string of tubular segments placed in the well bore results in a significant reduction in the diameter of pipe through which hydrocarbons can be carried to the surface. More importantly, to achieve the desired tubular diameter in the producing zone, the initial bore hole size at the surface must be sufficiently large to allow for a large diameter casing. The large initial bore hole size requires increased drilling time and increased material costs, including increased use of materials such as drilling mud and casing cement.

The technology of expandable tubulars addresses these shortcomings in the conventional casing/liner/screen hanging operations. Through radial expansion of successive strings of tubular segments until the outer wall of those segments contacts the inner wall of the host pipe, it is possible to create a tight fit between the expandable tubulars and the host pipe that holds the tubular segments in place and creates an annular seal. Further, it is possible to achieve a well bore of virtually uniform diameter. The expandable tubulars are expanded by various means known in the art, including, but not limited to, pulling or pushing fixed diameter expansion cones through the tubular, extruding the tubular off of a hydraulically-actuated expansion tool, or rotating an expansion tool while pulling or pushing it through the tubular.

The tubular segments to be expanded are typically coupled together using threaded connections in which the male end, or pin member, of one tubular is threadably connected to the female end, or box member, of an adjacent tubular. Alternatively, the ends of the adjacent tubulars may have a pin member at each end, with the box member being formed by a short coupling threaded onto the pin members. Similarly, a short coupling may be used to connect the pin member of one tubular to the box member of another tubular. Currently, the threaded connections and the tubular segments are expanded downhole during the same operation.

With the standard threaded pipe connections currently in use, problems can arise during and after expansion of the tubular segments at the threaded connection point between segments. First, the sealing ability of the threaded connection is often significantly diminished as a result of the expansion process. The threaded connection area thus becomes a source of potential leaks in the tubular strings. Second, conventional threaded tubular connections are also susceptible to splitting along the length of the box member when the connections are radially expanded. The radial expansion process concentrates the expansion stresses in any thin wall sections present in the box or pin members and can lead to the rupturing or splitting of the thin wall section of the box member. Third, backing off of the threaded connection can occur during the expansion process. Excessive backing off of the threaded connection can significantly decrease the strength or load carrying capability of the threaded connection or, potentially, disengage the connection.

What is needed is a threaded connection for expandable tubulars that maintains its sealing and coupling ability during and after expansion. It is an object of the present invention to provide an apparatus and method allowing for the expansion of a threaded connection between segments of expandable tubulars, while at the same time maintaining the sealing and coupling ability of the threaded connection. Those and other objectives will become apparent to those of skill in the art from a review of the specification below.

SUMMARY OF THE INVENTION

A method and apparatus for providing an expandable threaded connection between segments of expandable tubulars is disclosed. The disclosed invention is a unique expandable connection in which threaded connections are machined into pre-expanded ends of a tubular. Once the threaded connections are machined into the pre-expanded ends, two joints of expandable tubulars are connected together using the threads, thus creating a pre-expanded threaded connection. A string of expandable tubulars may be made up using pre-expanded threaded connections and lowered into a wellbore. Afterwards, the entire length of the string is expanded using known methods for expanding tubulars. During the downhole expansion operation, the individual segments of tubular as well as the pre-expanded threaded connections between them will be expanded toward the inside wall of the host casing or the open hole until they contact its inside wall. During this process, the outside diameter of the individual segments of tubular is expanded significantly more than the outside diameter of the pre-expanded threaded connections. The minimal downhole expansion of the pre-expanded threaded connection allows the threaded connection to maintain its sealing ability and coupling strength.

BRIEF DESCRIPTION OF THE DRAWINGS

The following figures form part of the present specification and are included to further demonstrate certain aspects of the present invention. The invention may be better understood by reference to one or more of these figures in combination with the detailed description of specific embodiments presented herein.

FIG. 5 is a side view of a series of expandable tubulars connected through use of pre-expanded threaded connections according to the present invention and inserted within a host pipe.

FIG. 6 is a side view of a string of expandable tubulars connected via pre-expanded threaded connections according to the present invention after the tubulars have been fully expanded within a host pipe.

DESCRIPTION OF ILLUSTRATIVE EMBODIMENTS

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Threaded tubular connections typically used in the production of oil and gas are comprised of pin members that will be stabbed into box members that are designed to receive them. The connections are then made-up by applying torque to the connection.

With the introduction of expandable tubulars technology, focus on the threaded connections between segments of tubulars that are expanded downhole has become increasingly more important. Currently, segments of expandable tubulars and the threaded connections coupling the segments together are expanded downhole in a single step. The threaded connections are thus subjected to the same amount of expansion as the entire tubular string. The significant expansion employed during expandable tubular applications can cause the threaded connections to lose their sealing ability and to become a source of potential leaks in the tubular strings. Additionally, the radial expansion of threaded connections can cause splitting or rupturing of the thin-walled areas of the box members of the threaded connections. Further, backing off of the threaded connections during the expansion process can weaken the coupling strength of the connection.

To alleviate these known and potential problems, the following disclosure describes a unique process in which threaded connections are machined on pre-expanded ends of a tubular. Once the threaded connections are machined into the pre-expanded ends, individual joints of expandable tubulars are connected together using the threads, thus creating a pre-expanded threaded connection. After a tubular string has been made up and lowered into a wellbore, the entire length of the string is expanded using known methods for expanding tubulars. During the expansion operation, the individual segments of tubular as well as the threaded connections between them will be expanded toward the inside wall of the host pipe or the open hole until they contact its inside wall. During this process, the outside diameter of the individual segments of tubular are expanded significantly more than the outside diameter of the pre-expanded threaded connections. The minimal downhole expansion of the pre-expanded threaded connection allows the threaded connection to maintain its sealing ability and coupling strength.

Figure 1:
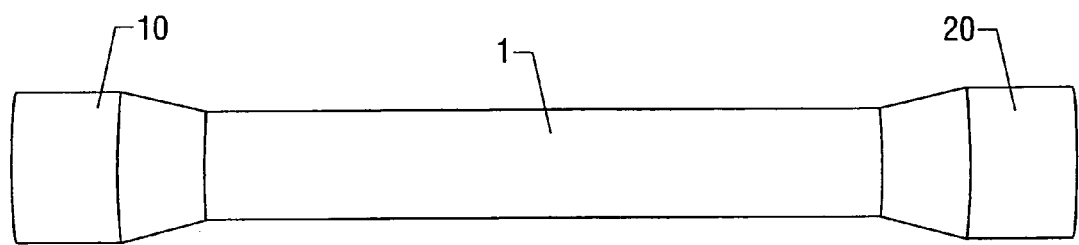
FIG. 1 is a side view of an expandable tubular with its ends pre-expanded according to one embodiment of the present invention.

Referring now to FIG. 1, a tubular joint 1 includes pre-expanded end 10 and pre-expanded end 20. In FIG. 1, pre-expanded end 10 and pre-expanded end 20 are the end portions of tubular joint 1 that have been expanded to a given shape and size. As part of tubular joint 1, pre-expanded end 10 and pre-expanded end 20 are made of the same material as tubular joint 1.

Figure 7:
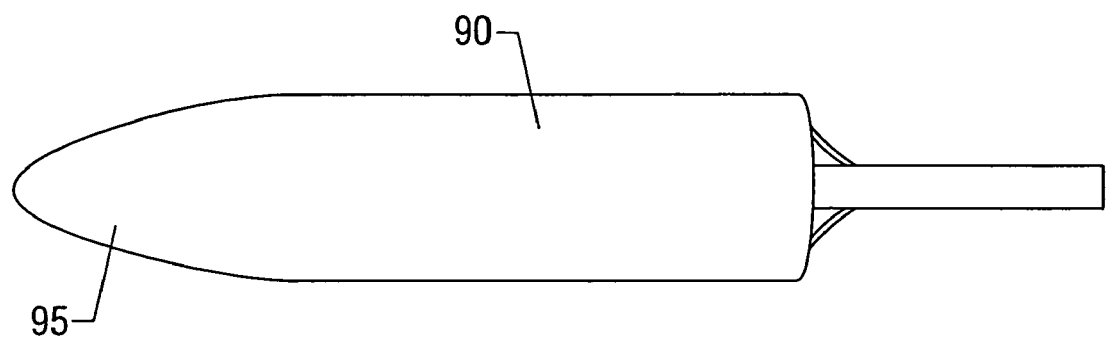
FIG. 7 is a side view of one type of expansion mandrel used to pre-expand the ends of the expandable tubular.
Figure 8:
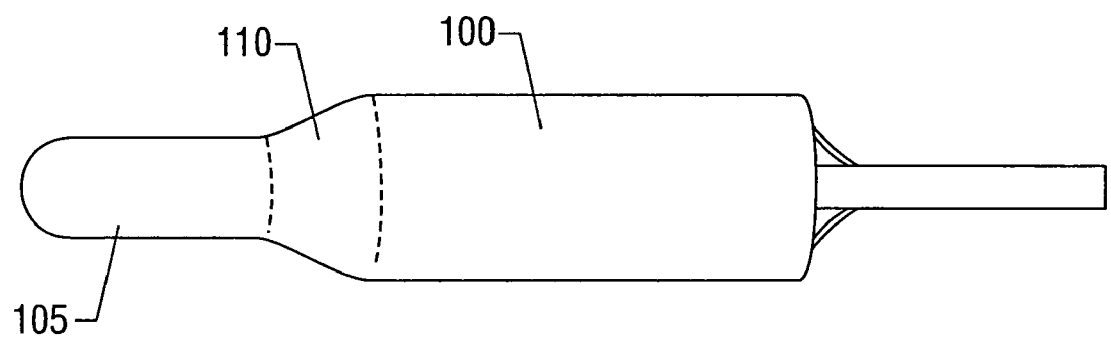
FIG. 8 is a side view of one type of expansion mandrel used to pre-expand the ends of the expandable tubular.

Pre-expanded end 10 and pre-expanded end 20 can be expanded by axially pushing a specifically shaped expansion tool into the ends of tubular joint 1 to a predetermined length. Expansion tools that can be used to form the pre-expanded ends are shown in FIG. 7 and FIG. 8. The expansion mandrel 90 shown in FIG. 7 includes a tapered expanding area 95 shaped to expand the ends 10 and 20 to the desired outer diameter. Tapered expanding area 95 is also shaped to provide the desired taper from the outer diameter of the pre-expanded ends to the tubular joint 1. Similarly, the expansion mandrel 100 shown in FIG. 8 includes a pilot section 105 and a tapered expanding area 110 shaped to expand the ends 10 and 20 to the desired outer diameter. The tapered expanding area 110 is also shaped to provide the desired taper from the outer diameter of the pre-expanded ends to the tubular joint 1. The pilot 105 is used to center the expansion mandrel 100 within tubular joint 1. Although expansion of pre-expanded ends 10 and 20 has been described with reference to expansion mandrels of the type shown in FIG. 7 and FIG. 8, the expansion of the ends of tubular joint 1 to form pre-expanded ends 10 and 20 can be accomplished by any known tubular expansion technique, including, but not limited to, expansion mandrels, rotary expansion tools, and combinations thereof. The amount of expansion of the outside diameter of the pre-expanded ends for the intended use is generally, but not limited to, approximately 15-25% measured at the extreme ends of the tubular diameter.

After end 10 and end 20 are expanded to their desired outer diameter, the expanded ends may be stress relieved by heating them to adequate temperature that is below the critical temperature of the tubular material by induction heating or any other suitable stress relieving method. Whether or not pre-expanded ends 10 and 20 are heat treated depends on numerous factors, and it is not always necessary or preferred to heat treat ends 10 and 20. Additionally, the threads for the pin and box members machined into ends 10 and 20, as discussed with reference to FIG. 2, can be machined into ends 10 and 20 before or after any stress relief or heat treatment is performed.

It is also conceived that the ends may be heat treated alone or, if necessary, the whole length of tubular joint 1 can be heat treated. Heat treating pre-expanded ends 10 and 20 and/or tubular joint 1 can be accomplished by quenching and tempering. It should be understood that quenching and tempering is only one method of heat treatment and does not preclude the pre-expanded ends 10 and 20 and/or tubular joint 1 from being heat treated by other methods such as normalizing or any other method where applicable.

Figure 2:
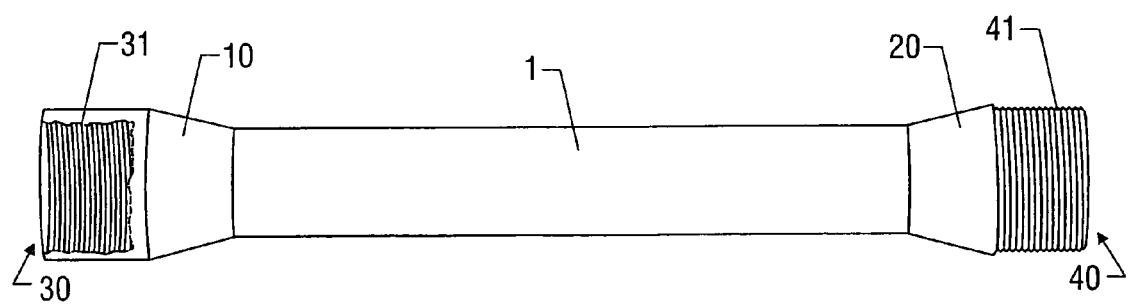
FIG. 2 is a side view of an expandable tubular with its ends pre-expanded and with threaded pin and box connections machined into the pre-expanded ends according to one embodiment of the present invention.

Referring now to FIG. 2, box member 30 has been machined into pre-expanded end 10. Pin member 40, with helical threads 41 extending along the length of pin member 40, has been machined into pre-expanded end 20. Box member 30 includes helical mating threads 31 that are shaped and sized to mate with helical threads 41 respectively on pin member 40 during make-up of a threaded connection between separate tubular joints or segments. The interengaged threads of pin member 40 with the corresponding threads of box member 30 on an adjacent joint provide a threaded connection upon final make-up. In this way, multiple segments of tubulars can be threadably connected at their pre-expanded ends to form pre-expanded threaded connections.

Figure 3:
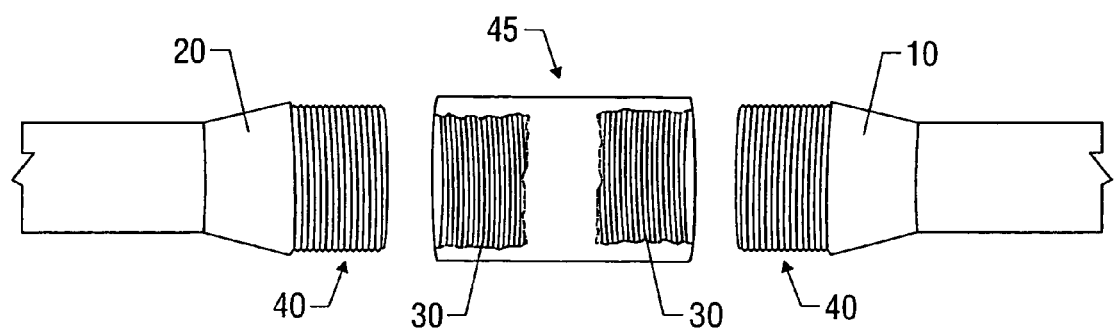
FIG. 3 is a side view of two expandable tubulars with their ends pre-expanded and with threaded pin connections machined into the pre-expanded ends for connection by a coupling member according to one embodiment of the present invention.

In an alternative embodiment of the present invention shown in FIG. 3, the pre-expanded ends 10 and 20 may have a pin member 40 at each end, with the box member 30 being formed by a short coupling 45 that threadedly engages the pin members. Similarly, a short coupling may be used to connect the pin member of the pre-expanded end of one tubular to the box member of the pre-expanded end of another tubular. Through use of such a coupling, multiple segments of tubulars can be threadably connected at their pre-expanded ends to form pre-expanded threaded connections.

When adjacent segments of tubulars are connected together via the pin and box members of their respective pre-expanded ends or via a short coupling, the outside diameter of the pre-expanded threaded connection so formed approximates the API drift diameter of the anticipated host pipe, that is the pipe in which the tubular string to be expanded is deployed in. If the tubular string is to be expanded in an open hole, the outside diameter of the pre-expanded threaded connection should approximate the expected drift diameter of the well bore. By way of example of the above, if a string of 5-½ in.×17 lb/ft. pipe is to be expanded inside a string of 7-⅝ in.×29.70 lb/ft. pipe, the outside diameter of the pre-expanded threaded connection between segments of the 5-½ in. pipe should be about 6.750 in., which equals the API drift diameter of the 7-⅝ in. host string. Because the outside diameter of the pre-expanded threaded connection approximates the API drift diameter of the host pipe, insertion of the tubular string into the host pipe is facilitated. One of skill in the art will recognize that the outer diameter of the pre-expanded threaded connection can be less than, substantially equal to, or slightly greater than the API drift diameter and still achieve the objectives of the present invention.

FIG. 5 shows multiple segments of tubular joint 1 coupled together via mating of adjacent pre-expanded ends to form pre-expanded threaded connections. FIG. 5 shows the larger outer diameter of the pre-expanded threaded connection between pre-expanded ends of adjacent tubular joints. As noted, in the preferred embodiment of the invention, the outer diameter of the pre-expanded threaded connections approximates the API drift diameter of the host pipe 100 such that the tubular string can more easily pass through the host pipe 100. Through successive coupling of tubular segments using the pin and box members in pre-expanded end 10 and pre-expanded end 20, a tubular string is created.

During the downhole expansion operation, both the pre-expanded threaded connections and the tubular segments themselves are expanded toward the inside wall of the host string 100 until they contact its inside wall. As a result of the downhole expansion process, the tubular joints' outer diameter in a preferred embodiment is expanded approximately 15%-25%. In contrast, the pre-expanded threaded connection formed by adjacent pre-expanded tubular ends is expanded only approximately 2%. The above percentages are given by way of example only. One of skill in the art will recognize that the percentage of expansion of the outside diameter of the expandable tubulars and/or the pre-expanded threaded connection can vary greatly depending on numerous characteristics, including, but not limited to, whether the tubular being expanded is a solid tubular or a slotted tubular, the material of the tubulars and connectors, and the wellbore geometry.

The minimal expansion of the pre-expanded threaded connection allows the connection to maintain its sealing ability and coupling strength. Generally, the threaded connection is joining the ends of two tubulars, with each segment of tubular so joined being approximately forty (40) feet (480 inches) in length. The pre-expanded threaded connection itself, formed by joining pre-expanded end 10 and pre-expanded end 20 of adjacent tubular joints, is approximately five (5) to ten (10) inches long. The above lengths are given by way of example only. One of skill in the art will recognize that the above lengths can vary greatly depending on numerous characteristics, including, but not limited to, the type and size of tubular being used and the type of threads being used. During the downhole expansion operation, the tubular joints that make up the tubular string are expanded past their yield point such that plastic deformation of the tubulars is accomplished. In contrast, the minimal downhole expansion of the pre-expanded threaded connection may remain in the elastic range. Because the length of the pre-expanded threaded connection is only a fraction of the total length of the tubular string, typically less than 1-2% of that length, the radial force exerted on the inner walls of the host pipe 100 by the plastic expansion of the much longer tubular segments provides a sufficient contacting force such that the tubular string will hang from the host pipe 100. Thus, it is not necessary to plastically expand the pre-expanded threaded connections. Alternatively, there may be circumstances when it is desirable to plastically deform the pre-expanded threaded connections. The pre-expanded threaded connections would still be less susceptible to leakage and backing off than conventional expanded connections. Additionally, in an alternative embodiment of the invention, a sealing material can be added around the pre-expanded threaded connections.

The minimal expansion of the pre-expanded threaded connection also allows the pre-expanded connection to become an integral part of the tubular string without any further significant change in the material properties of the connection. In contrast, the significant expansion of the tubular segments themselves causes the segments to generally become harder, as the expansion process acts as a "cold working" of the tubular segments.

FIG. 6 shows the individual tubular segments and the connection points between them after the downhole expansion operation is completed. As can be seen, the entire tubular string is expanded to an outer diameter that is substantially equal to the inner diameter of the host pipe 100. As noted, the contact between the inner wall of the host pipe 100 and the expanded tubular string creates a tight fit that holds the tubular string in place while also providing an annular seal.

Figure 9:
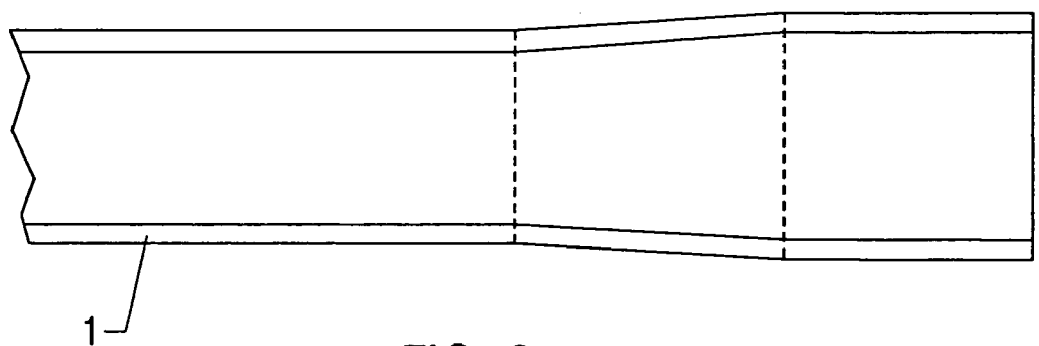
FIG. 9 is a side view of a string of expandable tubulars connected with a pre-expanded threaded connection that incorporates a gradual reduction of the outside diameter of the pre-expanded connection over a greater length of the expandable tubular allowing for ease of insertion into a well bore.

Although the above description has been limited to the expansion of a string of tubulars within a cased bore hole, the invention disclosed is not limited to use only in cased bore hole applications. The same process can be applied to open hole (non-cased) applications such as liner or screen applications. In an open hole application, it is preferred that the taper from the outside diameter of the pre-expanded threaded connection to that of the tubular joint is very gradual, typically less than a thirty (30) degree taper. This will allow the connection to slide easily inside and past certain formation diametrical restrictions that may occur inside the open hole. FIG. 9 shows a pre-expanded threaded connection with a gradual taper as described.

To allow for successful completion in an open hole application, the hole itself should be prepared in advance in a suitable manner. The mud weight should be adjusted to stabilize the wall of the hole. Additionally, certain additives may be added to the mud to condition the mud to reduce or eliminate loss circulation and/or increase the lubricity of the mud.

Further, in open hole applications in which diametrical restrictions are known or anticipated, another embodiment of the invention whereby the leading tubular (i.e., the first tubular joint) of the tubular string may be fitted with a reamer. This will enable completion by removing or reaming through obstructions protruding from the wall of the bore hole. Similarly, in another embodiment of the present invention, a drilling bit may be fitted to the leading tubular to remove or drill through any obstructions protruding from the wall of the bore hole. Preferably, the drill bit is milled out upon completion of the liner operation.

Figure 10:
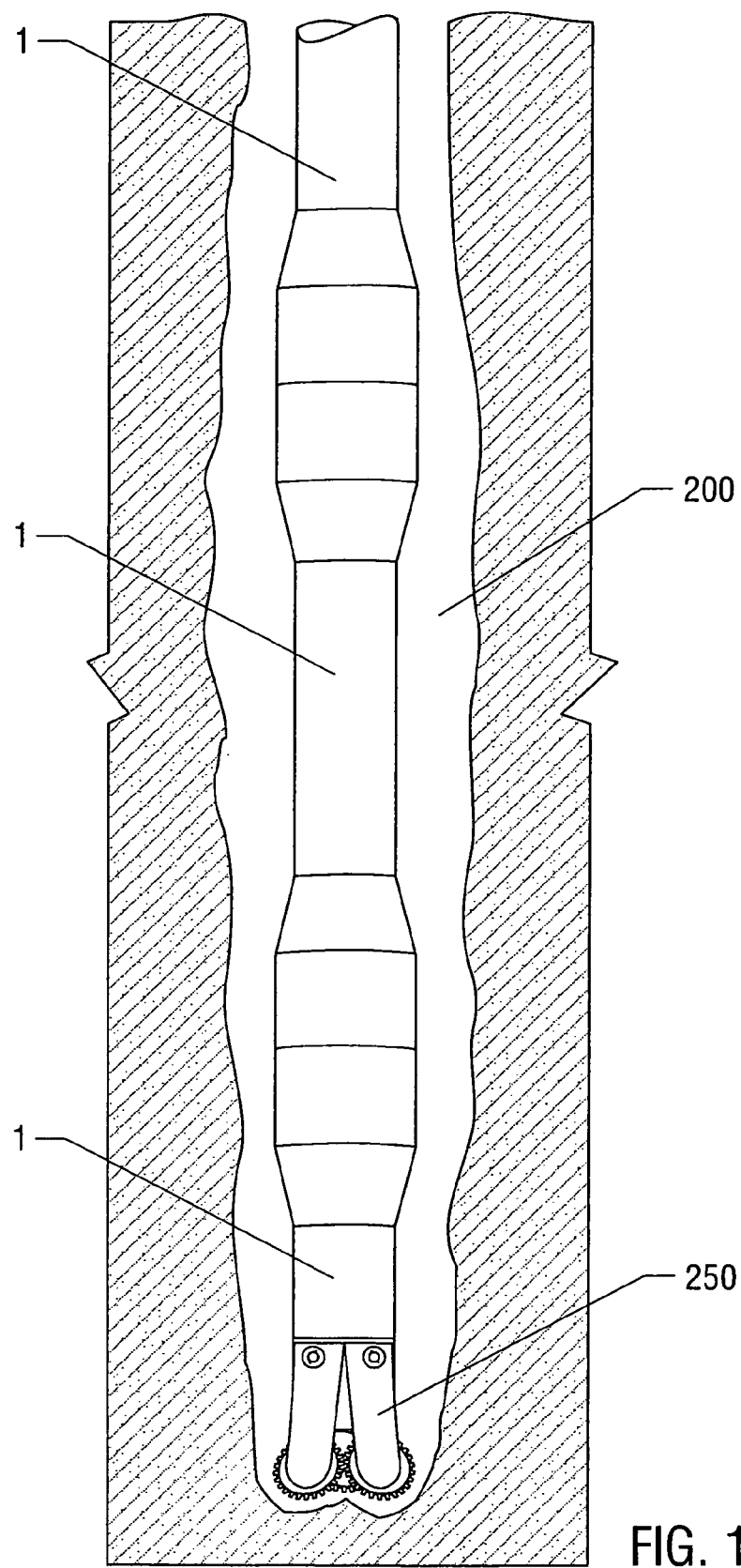
FIG. 10 is a side view of a series of expandable tubulars connected through use of pre-expanded threaded connections according to the present invention wherein the first tubular joint of the tubular string is fitted with a reamer or drill bit.

FIG. 10 shows a series of expandable tubular joints 1 connected through use of pre-expanded threaded connections and inserted within an uncased bore hole 200. The leading tubular joint of the tubular string shown in FIG. 10 is fitted with a reamer 250 such that obstructions in the bore hole can be removed in accordance with an embodiment of the present invention. One of skill in the art will recognize that the reamer 250 can be replaced with a drill bit or other suitable drilling apparatus capable of removing obstructions protruding from the wall of the bore hole.

The high torque imparted to the expandable threaded connection through operation of a reamer or drill bit as discussed above requires that the tubular joints are threaded with high torque connections. Higher torque connections suitable for such operations include, but are not limited to, connections disclosed in U.S. Pat. No. 6,767,035, incorporated herein by reference. Other suitable high-torque connections may include dove tail threads as described in U.S. Pat. No. 3,989,284.

In another embodiment of the invention, the expandable tubular shown in FIG. 1 and FIG. 2 may be secured from pipe mills or other sources with pre-expanded end 10 and pre-expanded end 20 already shaped, and with the mating threads 31 and 41 of pin member 40 and box member 30 already machined in the pre-expanded ends in accordance with the invention. Similarly, the expandable tubulars may be secured from pipe mills or other sources with pre-expanded ends 10 and 20 already shaped, while the mating threads 31 and 41 of pin member 40 and box member 30 may be machined in the pre-expanded ends by a different vendor at a different location. The tubulars, including pre-expanded end 10 and pre-expanded end 20, can be specified to meet the properties of a certain grade of tubular material. Additionally, the ability to use a separate vendor to machine the threads into pre-expanded ends 10 and 20 allows the user to choose from a wide range of thread types.

The expandable tubulars can be supplied from the mill "as rolled," which is also known in the industry as a "green tube." As rolled tubulars may meet some grade specifications, however, it may be necessary to use tubulars with specified chemistries. For example, the tubulars can be supplied with a specified chemistry suitable for quenching and tempering such that, after expanding the tubulars, the full length of the tubulars can be heat treated by the quench and temper method. Other chemistries may be specified for heat treating the tubulars by other known heat treatment methods.

Figure 4:
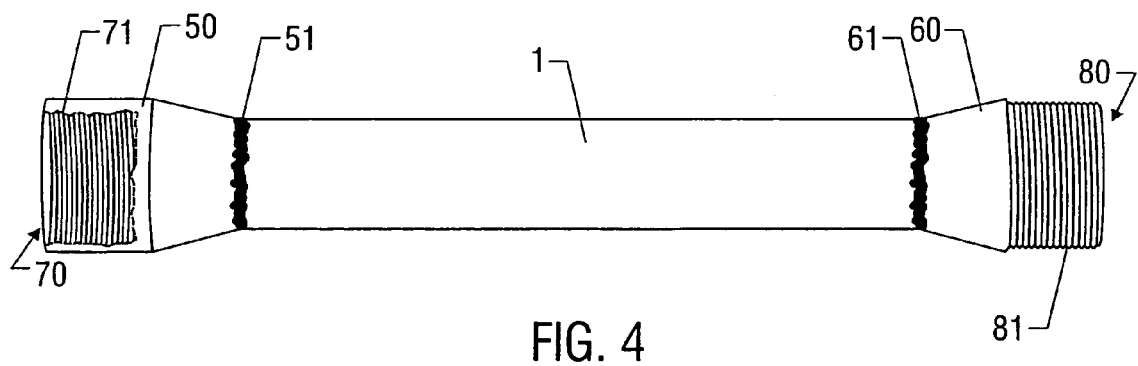
FIG. 4 is a side view of an expandable tubular with separate, shaped and sized tapered end joints welded to the expandable tubular according to one embodiment of the present invention.

FIG. 4 shows another embodiment of the present invention. In this embodiment, tapered end joint 50 and tapered end joint 60 are separate pieces from tubular joint 1. Tapered end joints 50 and 60 are shaped and sized to correspond to the shape and outside diameter of pre-expanded ends 10 and 20 shown in FIGS. 1 and 2. Tapered end joints 50 and 60 can be forged, formed by other methods known in the industry, or can be pre-expanded to the desired dimensions and shape by any of the tubular expansion methods described herein. Additionally, tapered end joints 50 and 60 are short pieces of tubular, typically only in the range of approximately 1 to 3 feet in length. This range of lengths is given by way of example only, and one of skill in the art will appreciate that the lengths of tapered end joints 50 and 60 can be outside the above range and still accomplish the objectives of the present invention.

Tapered end joints 50 and 60 are connected to the ends of the tubular joint 1 at connection 51 and connection 61. Tapered end joints 50 and 60 can be connected to the ends of tubular joint 1 by any suitable tubular connection method, including, but not limited to, welding.

Similar to pre-expanded ends 10 and 20 of FIGS. 1 and 2, tapered end joint 50 includes a box member 70 that includes helical mating threads 71 that are shaped and sized to mate with helical threads 81 respectively on pin member 80 machined in tapered end joint 60. By threadably coupling tapered end joint 60 and tapered end joint 50 of adjacent tubular segments, a pre-sized threaded connection is created.

The use of separate tapered end joints that function as pre-expanded ends has advantages that can be readily understood. One such advantage is that the tapered end joints 50 and 60 can be made of a different grade of material than the mother tubular, such as a stronger grade of material. For example, the mother tubular is made from N-80 grade material and the tapered end joints are made of P-110 grade material.

While the apparatus, compositions and methods of this invention have been described in terms of preferred or illustrative embodiments, it will be apparent to those of skill in the art that variations may be applied to the process described herein without departing from the concept and scope of the invention. All such similar substitutes and modifications apparent to those skilled in the art are deemed to be within the scope and concept of the invention as it is set out in the following claims.

The invention claimed is:

1. An expandable threaded tubular connection comprising:
    a first tubular segment with a pre-expanded end, the pre-expanded end including a pin member with threads; and
    a second tubular segment with a pre-expanded end, the pre-expanded end including a box member with threads suitable for threadedly engaging said threads of said pin member of said first tubular segment,
    wherein the first and second tubular segments, the pre-expanded ends, and the pin and box member threads are expanded after the expandable threaded tubular connection is made-up and inserted downhole, wherein a sealing ability and coupling strength of the expandable threaded tubular connection is not compromised by the expansion.

2. The expandable threaded tubular connection of claim 1, wherein the box member threads have been machined into the pre-expanded end of the second tubular segment, the box member threads being helical mating threads that are shaped and sized to mate with helical threads on the pin member.

3. The expandable threaded tubular connection of claim 1, wherein the pin member threads have been machined into the pre-expanded end of the first tubular segment, the pin member threads being helical threads extending substantially along the length of the pin member.

4. The expandable threaded tubular connection of claim 1, wherein the pre-expanded end of the first tubular segment and the pre-expanded end of the second tubular segment are expanded by inserting an expansion tool into the ends of the first tubular segment and the second tubular segment respectively to a predetermined length.

5. The expandable threaded tubular connection of claim 1, wherein the outside diameters of the pre-expanded ends of the first tubular segment and the second tubular segment are substantially equal to the API drift diameter of a host pipe into which the connection is lowered.

6. The expandable threaded tubular connection of claim 1, wherein the outside diameters of the pre-expanded ends of the first tubular segment and the second tubular segment are less than the API drift diameter of a host pipe into which the connection is lowered.

7. The expandable threaded tubular connection of claim 1, wherein the outside diameters of the pre-expanded ends of the first tubular segment and the second tubular segment are greater than the API drift diameter of a host pipe into which the connection is lowered.

8. The expandable threaded tubular connection of claim 1, wherein the outside diameter of the first and second tubular segments are expanded more than the outside diameter of the pre-expanded ends.

9. The expandable threaded tubular connection of claim 1, wherein the first tubular segment and the second tubular segment are radially expanded past their yield point.

10. The expandable threaded tubular connection of claim 1, further comprising a sealing material surrounding the expandable threaded tubular connection.

11. The expandable threaded tubular connection of claim 1, wherein the pre-expanded end of the first tubular segment and the pre-expanded end of the second tubular segment are stress relieved.

12. The expandable threaded tubular connection of claim 1, wherein the pre-expanded end of the first tubular segment and the pre-expanded end of the second tubular segment are heat treated.

13. The expandable threaded tubular connection of claim 1, wherein the entire length of the first tubular segment and the second tubular segment is heat treated.

14. The expandable threaded tubular connection of claim 1, wherein the first tubular segment constitutes the leading tubular in a string of tubulars inserted in a bore hole and has a reamer or drill bit connected to it.

15. The expandable threaded tubular connection of claim 1, wherein the first tubular segment and the second tubular segment are supplied by a tubular manufacturer with the pre-expanded ends already shaped and sized.

16. An expandable threaded tubular connection for well bore production tubulars comprising:
   a first expandable tubular segment with a first tapered end joint connected to the end of the first expandable tubular segment, wherein the first tapered end joint has been pre-expanded to a given shape and size by inserting an expansion tool into the first tapered end joint to a predetermined length, the first tapered end joint including a pin member with thread means; and
   a second expandable tubular segment with a second tapered end joint connected to the end of the second expandable tubular segment, wherein the second tapered end joint has been pre-expanded to a given shape and size by inserting an expansion tool into the second tapered end joint to a predetermined length, the second tapered end joint including a box member with thread means suitable for threadedly engaging said pin member of said first tapered end joint;
   wherein the shape and size of the first and second tapered end joints are selected such that the first and second tapered end joints, including the thread means of the first and second tapered end joints, are expanded less than the first and second expandable tubular segments after the expandable threaded tubular connection is inserted downhole; and
   wherein said expandable threaded tubular connection maintains its sealing ability following expansion of the expandable threaded tubular connection after it has been inserted downhole.

17. The expandable threaded tubular connection of claim 16 wherein the expansion tool used to expand the first tapered end joint and the second tapered end joint is an expansion mandrel.

18. The expandable threaded tubular connection of claim 17 wherein the expansion mandrel includes a pilot section used to center the expansion mandrel within the first tapered end joint and the second tapered end joint.

19. The expandable threaded tubular connection of claim 16 wherein the expansion tool is a rotary expansion tool.

20. The expandable threaded tubular connection of claim 16 wherein the first tapered end joint and the second tapered end joint are made of a different material than the material of the first tubular segment and the second tubular segment.

21. The expandable threaded tubular connection of claim 16 further comprising a sealing material surrounding the expandable threaded tubular connection.

22. An expandable threaded tubular connection for well bore production tubulars comprising:
   a first expandable tubular segment with a first tapered end joint connected to the end of the first expandable tubular segment, wherein the first tapered end joint is forged to a given shape and size such that the inner diameter of the first tapered end joint is greater than the inner diameter of the first expandable tubular segment, the first tapered end joint including a pin member with thread means; and
   a second expandable tubular segment with a second tapered end joint connected to the end of the second expandable tubular segment, wherein the second tapered end joint is forged to a given shape and size such that the inner diameter of the second tapered end joint is greater than the inner diameter of the second expandable tubular segment, the second tapered end joint including a box member with thread means suitable for threadedly engaging said thread means of said pin member of said first tapered end joint;
   wherein the shape and size of the first and second tapered end joints are selected such that the first and second tapered end joints, including the thread means of the first and second tapered end joints, are expanded less than the first and second expandable tubular segments after the expandable threaded tubular connection is inserted downhole; and
   wherein said expandable threaded tubular connection maintains its sealing ability following expansion of the expandable threaded tubular connection after it has been inserted downhole.

23. An expandable threaded tubular connection for well bore tubulars comprising:

a first expandable casing segment having a first tapered end joint, wherein the first tapered end joint is pre-expanded such that the inner diameter of the first tapered end joint is greater than the inner diameter of the remainder of the first expandable casing segment, the first tapered end joint including a pin member with thread means; and a second expandable casing segment having a second tapered end joint, wherein the second tapered end joint is pre-expanded such that the inner diameter of the second tapered end joint is greater than the inner diameter of the remainder of the second expandable casing segment, the second tapered end joint including a box member with thread means suitable for threadedly engaging said thread means of said pin member of said first tapered end joint;

wherein the inner diameters of the first and second tapered end joints are selected to allow for less expansion of the end joints as compared to the expansion of the first and second expandable casing segments when the first and second expandable casing segments and first and second tapered end joints, including the thread means of the first and second tapered end joints, are expanded after the expandable threaded connection is made-up and inserted downhole.

24. An expandable threaded tubular connection for well bore tubulars comprising:

a first expandable liner segment having a first tapered end joint, wherein the first tapered end joint is pre-expanded such that the inner diameter of the first tapered end joint is greater than the inner diameter of the remainder of the first expandable liner segment, the first tapered end joint including a pin member with thread means; and a second expandable liner segment having a second tapered end joint, wherein the second tapered end joint is pre-expanded such that the inner diameter of the second tapered end joint is greater than the inner diameter of the remainder of the second expandable liner segment, the second tapered end joint including a box member with thread means suitable for threadedly engaging said thread means of said pin member of said first tapered end joint;

wherein the inner diameters of the first and second tapered end joints are selected to allow for less expansion of the end joints as compared to the expansion of the first and second expandable liner segments when the first and second expandable liner segments and first and second tapered end joints, including the thread means of the first and second tapered end joints, are expanded after the expandable threaded connection is made-up and inserted downhole.

* * * * *